United States Patent
Huh et al.

(10) Patent No.: US 9,537,482 B2
(45) Date of Patent: Jan. 3, 2017

(54) TOUCH PANEL AND DISPLAY DEVICE INCLUDING THE SAME

(71) Applicant: Samsung Display Co., Ltd., Yongin, Gyeonggi-Do (KR)

(72) Inventors: Jae Won Huh, Seoul (KR); Hwan-Hee Jeong, Cheonan-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 21 days.

(21) Appl. No.: 14/327,067

(22) Filed: Jul. 9, 2014

(65) Prior Publication Data

US 2015/0188538 A1     Jul. 2, 2015

(30) Foreign Application Priority Data

Dec. 27, 2013  (KR) .......................... 10-2013-0166028

(51) Int. Cl.
*G06F 3/044*     (2006.01)
*H03K 17/96*     (2006.01)

(52) U.S. Cl.
CPC ........... *H03K 17/9622* (2013.01); *G06F 3/044* (2013.01); *H03K 2017/9613* (2013.01); *H03K 2217/96031* (2013.01); *H03K 2217/960745* (2013.01); *H03K 2217/960755* (2013.01)

(58) Field of Classification Search
CPC .............. G06F 3/041; G06F 3/03545–3/03547
See application file for complete search history.

(56) References Cited

U.S. PATENT DOCUMENTS

| | | | |
|---|---|---|---|
| 6,597,427 B1 * | 7/2003 | Katsu | G02F 1/13338 349/192 |
| 8,368,657 B2 | 2/2013 | Borras | |
| 2010/0025470 A1 * | 2/2010 | Nakagawa | G06K 7/14 235/462.01 |
| 2011/0210936 A1 | 9/2011 | Wang et al. | |
| 2012/0013653 A1 | 1/2012 | Vogsland | |
| 2012/0062487 A1 * | 3/2012 | Lee | G06F 3/044 345/173 |

FOREIGN PATENT DOCUMENTS

| | | |
|---|---|---|
| JP | 2010-34284 A | 2/2010 |
| JP | 5151874 B2 | 12/2012 |
| KR | 10-2006-0075013 A | 7/2006 |
| KR | 10-2013-0087691 A | 8/2013 |

* cited by examiner

*Primary Examiner* — Alexander Eisen
*Assistant Examiner* — Cory Almeida
(74) *Attorney, Agent, or Firm* — Knobbe Martens Olson & Bear LLP (57) ABSTRACT

A touch panel and display device including the same are disclosed. In one aspect, the touch panel includes a substrate, at least one first signal line formed over the substrate and extending in a first direction, and at least one second signal line formed over the substrate and extending in a second direction that crosses the first direction. A plurality of identification patterns are formed in areas corresponding to at least one of the first and second signal lines.

20 Claims, 11 Drawing Sheets

TOUCH PANEL AND DISPLAY DEVICE INCLUDING THE SAME

CROSS-REFERENCE TO RELATED APPLICATIONS

This application claims priority to and the benefit of Korean Patent Application No. 10-2013-0166028 filed in the Korean Intellectual Property Office on Dec. 27, 2013, the entire contents of which are incorporated herein by reference.

BACKGROUND

Field

The described technology generally relates to a touch panel, and more particularly, to a capacitive touch panel and a display device including the same.

Description of the Related Technology

Touch panels are input devices that recognize the touch input of a pen or a user's finger. Touch panels have been used as input devices for organic light-emitting diode (OLED) displays and liquid crystal displays (LCDs).

When a capacitive touch sensor is included in a touch panel to receive touch input, the touch panel measures a change in capacitance of the touch sensor to detect the position of the touch input.

SUMMARY OF CERTAIN INVENTIVE ASPECTS

One inventive aspect is a touch panel that can optically determine accurate coordinates of a location where a failure has occurred during a failure test of the touch panel and a display device including the same.

Another aspect is a touch panel including a substrate, a first signal line formed on the substrate and extended in a first direction, a second signal line formed on the substrate and extended in a second direction that crosses the first direction and thus crossing the first signal line, and identification patterns viewed at at least one of the first signal line and the second signal line.

The touch pane further includes an insulating layer covering the first signal line and the second signal line and the identification patterns may be viewed through an opening formed in at least one of the first signal line and the second signal line.

The identification patterns may have numeric shapes.

The identification patterns may have text shapes.

The first signal line may include a plurality of first signal lines and the first signal lines may be arranged at a distance from each other along the second direction.

The second signal line may include a plurality of second signal liens and the second signal lines may be arranged at a distance from each other along the first direction.

The identification patterns may include first sub-identification patterns respectively viewed at the first signal lines and first sub-identification patterns viewed at neighboring first signal lines among the first signal lines may have different shapes.

The first signal lines may include first crossing portions formed in portions crossing the second signal lines, first connection lines connected with ends of the first crossing portions along the first direction, and second connection lines connected with the other ends of the first crossing portions along the first direction.

The first sub-identification patterns may be viewed with the same shape at the first connection line and the second connection line, respectively.

The first sub-identification patterns may be viewed as a pair, respectively, at the first connection line and the second connection line.

The first sub-identification pattern may be viewed at the first crossing portion.

The first sub-identification patterns may correspond to locations of the first signal lines.

The first sub-identification patterns may correspond to locations of the second signal lines.

The first sub-identification patterns may be viewed at the first signal lines with shapes having a predetermined order along the second direction. The identification patterns may include second sub-identification patterns respectively viewed at the second signal lines and second sub-identification patterns viewed at neighboring second signal lines among the second signal lines may respectively have different shapes.

The second signal lines may include second crossing portions formed in portions crossing the first signal lines, third connection lines connected with ends of the second crossing portions along the second direction, and fourth connection lines connected with the other ends of the second crossing portions along the second direction.

The second sub-identification patterns may be respectively viewed with the same shape at the third connection line and the fourth connection line.

The second sub-identification patterns may be respectively viewed as a pair at the third connection line and the fourth connection line.

The second sub-identification patterns may correspond to locations of the second signal lines.

The second sub-identification patterns may be viewed with shapes having a predetermined order along the first direction at the second signal lines, respectively.

Another aspect is a display device including a display panel displaying an image and the above-described touch panel formed on the display panel.

Another aspect is a touch panel including a substrate, at least one first signal line formed over the substrate and extending in a first direction, and at least one second signal line formed over the substrate and extending in a second direction that crosses the first direction, wherein a plurality of identification patterns are formed in areas corresponding to at least one of the first and second signal lines.

The touch panel further includes an insulating layer covering the first and second signal lines, wherein each of the identification patterns is formed as an opening in the insulating layer and the at least one of the first and second signal lines. The identification patterns have numeric shapes. The identification patterns have text shapes. The at least one first signal line includes a plurality of first signal lines and the first signal lines are spaced apart from each other in the second direction. The at least one second signal line includes a plurality of second signal lines and the second signal lines are spaced apart from each other in the first direction. The identification patterns includes a plurality of first sub-identification patterns respectively formed in the first signal lines and the first sub-identification patterns formed in neighboring first signal lines have different shapes. Each of the first signal lines includes a plurality of first crossing portions formed at intersections between the first and second signal lines, wherein each of the first crossing portions includes first and second ends opposing each other in the first direction, a plurality of first connection lines respectively electrically connected to the first ends of the first crossing portions, and a plurality of second connection lines respectively electrically connected to the second ends of the first crossing portions.

The first sub-identification patterns are formed in the first and second connection lines and the first sub-identification patterns formed in the same first signal line have substantially the same shape. The first sub-identification patterns formed in the first and second connection lines connected to the same first crossing portion form a pair of first sub-identification patterns that identify the corresponding first crossing portion. Each of the first sub-identification patterns is formed in a corresponding one of the first crossing portions. Each of the first sub-identification patterns identifies the location of the corresponding first signal line. Each of the first sub-identification patterns identifies the location of the corresponding second signal line. The first sub-identification patterns have substantially shapes of numbers arranged in a predetermined order in the second direction. The identification patterns includes a plurality of second sub-identification patterns respectively formed in the second signal lines and the second sub-identification patterns formed in neighboring second signal lines have different shapes. Each of the second signal lines includes a plurality of second crossing portions formed at intersections between the first and second signal lines, wherein each of the second crossing portions includes first and second ends opposing each other in the second direction, a plurality of third connection lines respectively electrically connected to the first ends of the second crossing portions, and a plurality of fourth connection lines respectively electrically connected to the second ends of the second crossing portions.

The second sub-identification patterns are formed in the third and fourth connection lines and the second sub-identification patterns formed in the same second signal line have substantially the same shape. The second sub-identification patterns formed in the third and fourth connection lines connected to the same second crossing portion form a pair of second sub-identification patterns that identify the corresponding second crossing portion. Each of the second sub-identification patterns identifies the location of the corresponding second signal line. The second sub-identification patterns have substantially shapes of numbers arranged in a predetermined order in the first direction.

Another aspect is a display device including a display panel configured to display an image and a touch panel formed over the display panel, wherein the touch panel includes a substrate, a plurality of first signal lines formed over the substrate and extending in a first direction, and a plurality of second signal lines formed over the substrate and extending in a second direction that crosses the first direction, wherein a plurality of identification patterns are formed in, above, or below at least one of the first and second signal lines.

Each of the identification patterns has a shape that identifies the location of the identification pattern. The identification patterns include a plurality of first sub-identification patterns respectively formed in the first signal lines, wherein the first sub-identification patterns uniquely identify the first signal lines, and a plurality of second sub-identification patterns respectively formed in the second signal lines, wherein the second sub-identification patterns uniquely identify the second signal lines. The display device further includes an insulating layer formed over the first and second signal lines, wherein the identification patterns are formed in the insulating layer.

According to at least one embodiment, the touch panel can optically determine accurate coordinates of a location where a failure occurs during a failure test of the touch panel and a display device including the same.

DETAILED DESCRIPTION OF CERTAIN INVENTIVE EMBODIMENTS

Recently, display devices have been manufactured with increasing size and thus touch panels have correspondingly increased in size. Testing these large touch panels for failure typically includes using an optical testing unit. Due to their large size, the optical determination of the coordinates of the failure within the touch panel may be inaccurate.

The described technology will be described more fully hereinafter with reference to the accompanying drawings, in which exemplary embodiments are shown. As those skilled in the art would realize, the described embodiments may be modified in various different ways, all without departing from the spirit or scope of the described technology.

Accordingly, the drawings and description are to be regarded as illustrative in nature and not restrictive. Like reference numerals designate like elements throughout the specification.

Further, in exemplary embodiments, since like reference numerals designate like elements having the same configuration, a first exemplary embodiment is representatively described, and in other exemplary embodiments, only configurations different from the first exemplary embodiment will be described.

In addition, the sizes and thicknesses of each the element shown in the drawings may be exaggerated for better understanding and ease of description, but the described technology is not limited thereto.

In the drawings, the thicknesses of layers, films, panels, regions, etc., may be exaggerated for the sake of clarity. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of the stated elements but not the exclusion of any other elements. Further, in the specification, the word "on" refers to being positioned above or below the referenced object, but does not only refer to being positioned on the upper side of the referenced object portion based on the orientation of the depicted device with respect to the direction of gravity. The term "substantially" as used in this disclosure means completely, almost completely, or to any significant degree.

Hereinafter, a display device according to an exemplary embodiment will be described with reference to FIG. 1 to FIG. 5.

Figure 1:
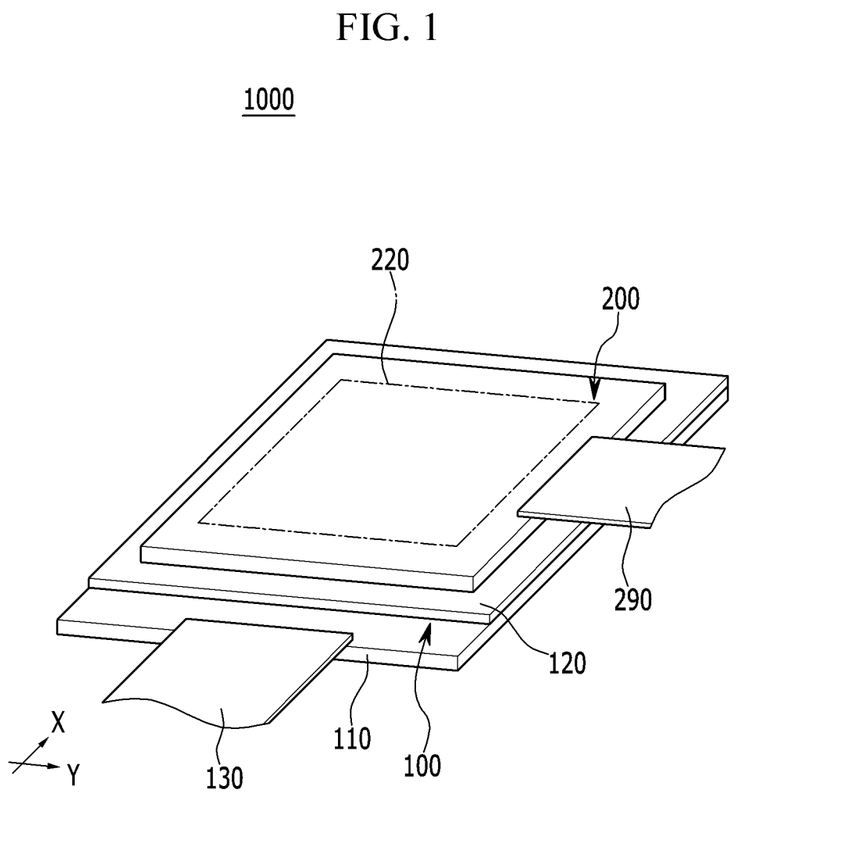
FIG. 1 is a perspective view of a display device according to an exemplary embodiment.
Figure 2:
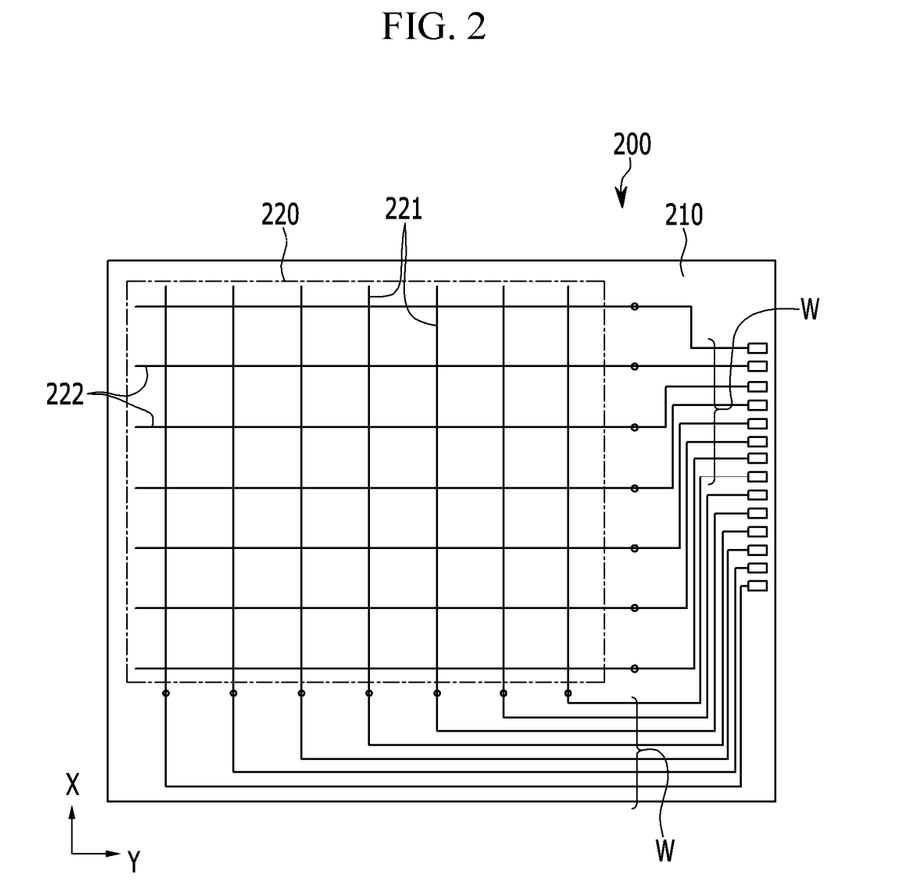
FIG. 2 schematically shows a touch panel included in the display device according to an exemplary embodiment.

As shown in FIG. 1 and FIG. 2, the display device 1000 includes a display panel 100, and a touch panel 200 provided on the display panel 100 and functioning as an input means for the display panel 100. The display panel 100 includes a plurality of pixels formed in a display area and displays an image.

Here, a pixel refers to the minimum unit that for displaying an image.

The display panel 100 includes a first display substrate 110 on which organic light-emitting diodes (OLEDs) are formed and a second display substrate 120 attached to the first display substrate 110. The first display substrate 110 is wider than the second display substrate 120 and protrudes therefrom. A first flexible printed circuit board 130 is electrically connected to the protruded portion. A plurality of pad electrodes may be formed in the first flexible printed circuit board 130 to transmit electrical signals to a scan driver and a data driver of the display device 1000.

In the FIG. 1 embodiment, the display panel 100 is described as an OLED display. However, the described technology is not limited thereto, and in other embodiments, the display panel can be a liquid crystal display (LCD) panel or a plasma display panel (PDP).

Although not illustrated, the touch panel 200 may include a touch controller and a touch driver. The touch controller digitalizes an electrical analog signal received from the touch panel 200 into a digital signal via a converter to calculate touch input position information. The touch driver is electrically connected to an image controller (not shown) of the display panel 100 to process a selection made by the touch input or to move a pointer on a screen according to a coordinate signal received from the touch controller.

The touch panel 200 is a capacitive touch panel and a second flexible printed circuit board 290 is electrically connected to one side of the touch panel 200. A driving circuit (not shown) may be connected to the second flexible printed circuit board 290 so as to detect an input location of the touch panel 200. A touch unit or touch sensor 220 that recognizes touch input of the user is formed in the touch panel 200.

The touch unit 220 includes a plurality of first signal lines 221 extending in a first direction X and sequentially arranged in a second direction Y that crosses the first direction X. The touch unit 220 further includes a plurality of second signal lines 222 extending in the second direction Y and sequentially arranged in the first direction X.

The first and second signal lines 221 and 222 substantially perpendicularly cross each other to form a stripe pattern. However, according to other embodiments, the first and second signal lines 221 and 222 cross each other at a predetermined crossing angle.

Each of the first and second signal lines 221 and 222 are electrically connected to the second flexible printed circuit board 290 through wires W.

A voltage is sequentially applied to the first and second signal lines 221 and 222 and thus the respective first and second signal lines 221 and 222 are electrically charged. When a touch input is received in the first or second signal lines 221 or 222, the capacitance of the touch signal lines is altered so that the location of the touch input can be determined based on the change in capacitance.

Hereinafter, the touch panel 200 included in the display device 1000 will be described in further detail with reference to FIG. 3 to FIG. 5.

Figure 3:
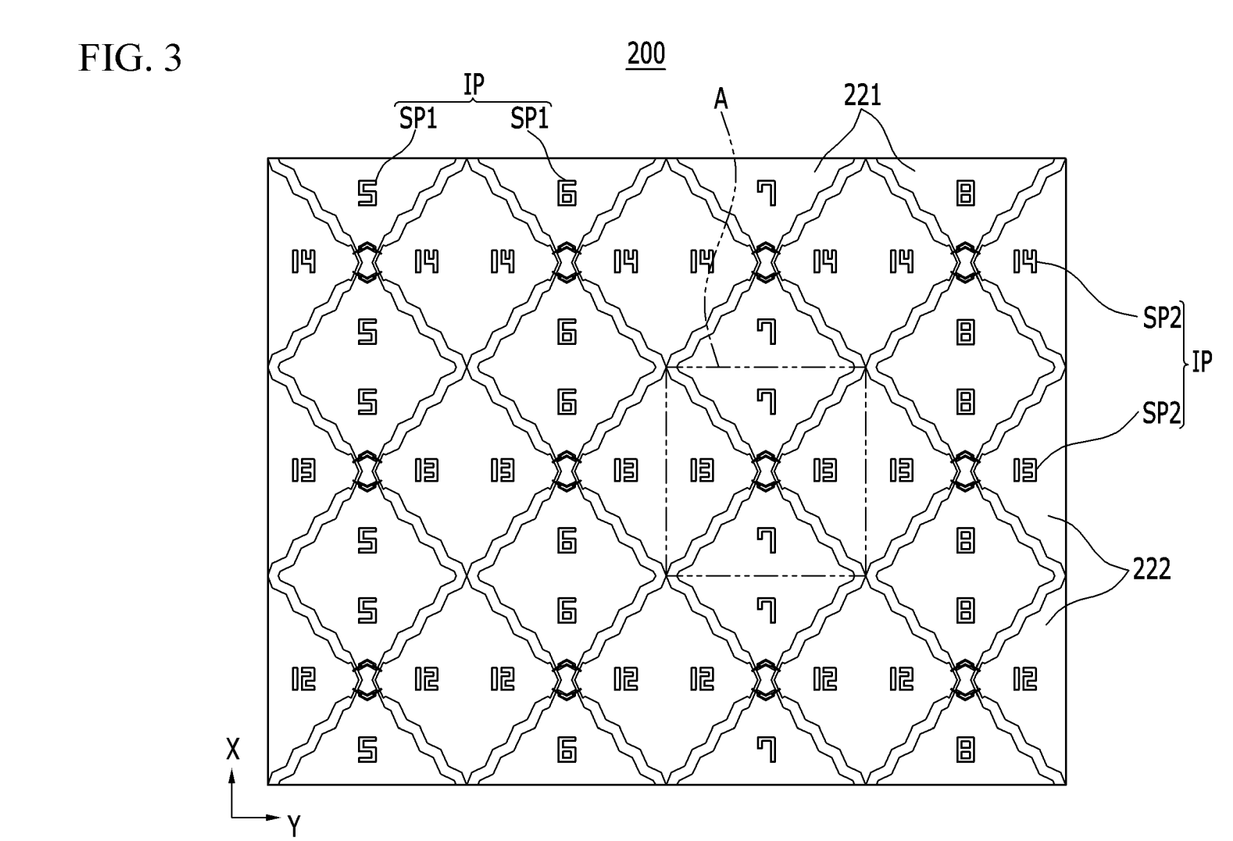
FIG. 3 is a top plan view of a portion of the touch panel included in the display device according to an exemplary embodiment.
Figure 4:
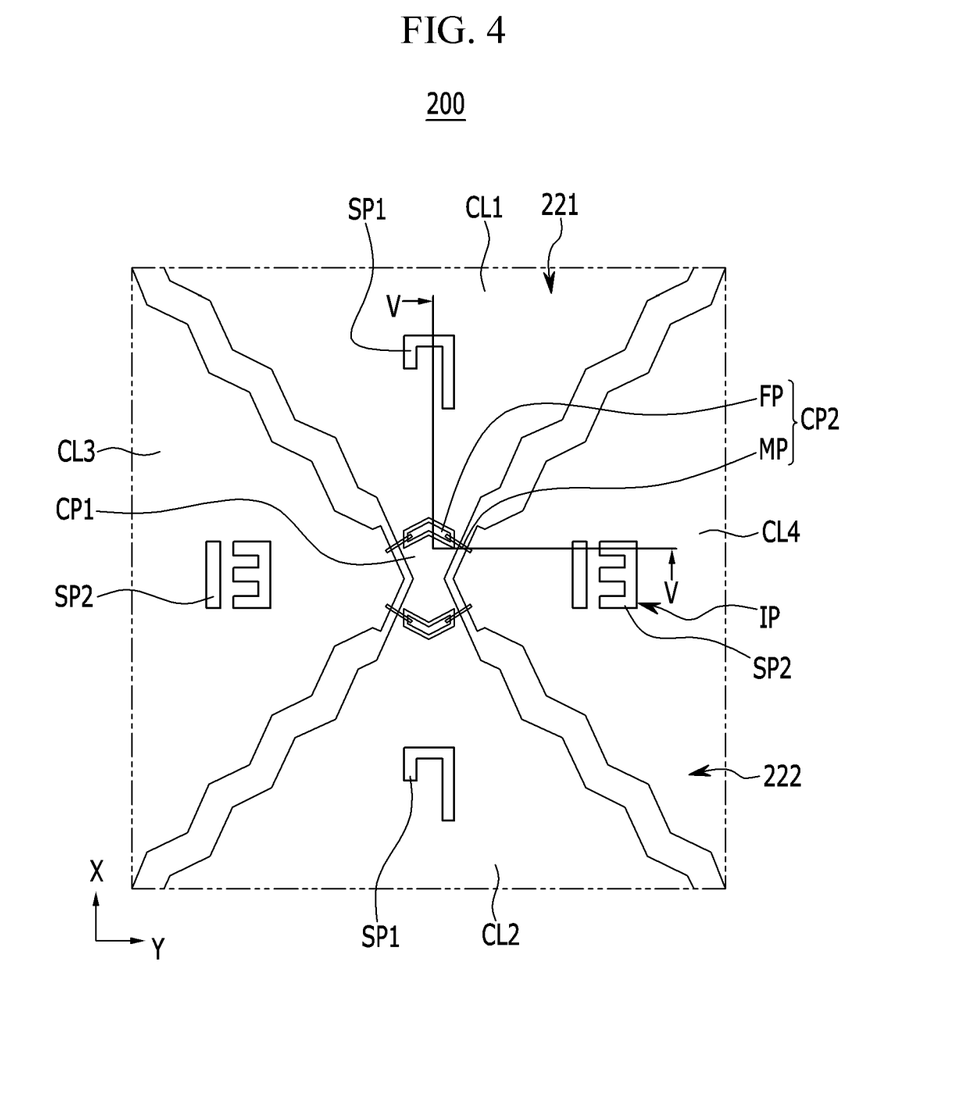
FIG. 4 is an enlarged view of a portion A of FIG. 3.
Figure 5:
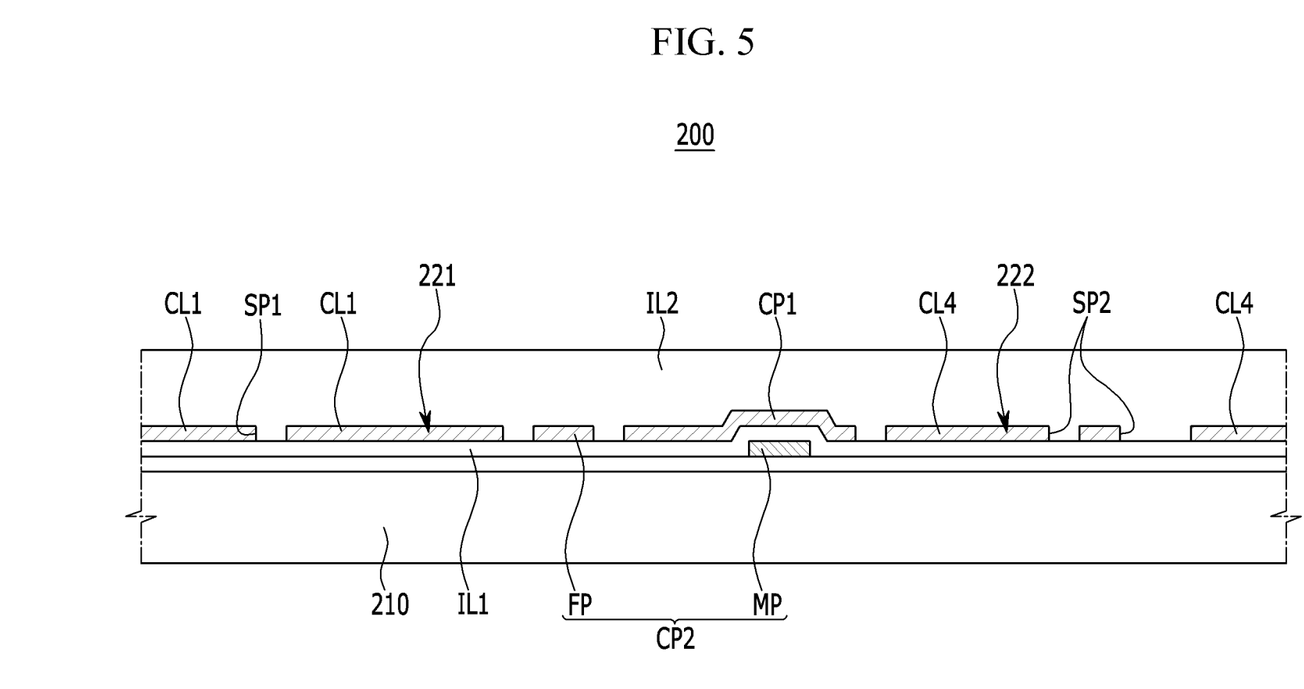
FIG. 5 is a cross-sectional view of FIG. 4, taken along the line V-V.

As shown in FIG. 3 to FIG. 5, the touch panel 200 includes a substrate 210, a first insulating layer IL1, the first signal lines 221, the second signal lines 222, a second insulating layer IL2, and identification patterns IP.

The substrate 210 is formed of a light transmissive insulating substrate such as glass, quartz, a ceramic, or a polymer, and can be flexible.

The first insulating layer IL1 is formed on the substrate 210, and may include a silicon oxide (SiOx) or a silicon nitride (SiNx).

The first signal lines 221 are formed on the substrate 210 and extend in the first direction X. A plurality of first signal lines 221 are formed and the first signal lines 221 are separated from each other and arranged along the second direction Y that crosses the first direction X. The first signal lines 221 include a first crossing portion CP1, first connection lines CL1, and second connection lines CL2.

The first crossing portion CP1 is formed on the first insulating layer LI1 in an area that crosses the second signal lines 222.

The first connection lines CL1 are respectively connected to ends of the first crossing portions CP1 in the first direction X and thus extend in the first direction X. Each first connection line CL1 has a shape that expands in the first direction X away from the first crossing portion CP1. The first connection line CL1 is formed on the first insulating layer IL1 and is thus formed on the same layer as the first crossing portion CP1.

The second connection lines CL2 are respectively connected to the other ends of the first crossing portions CP1 in the first direction X and thus extend in the first direction X. Each second connection line CL2 has a shape that expands in the first direction X away from the first crossing portion CP1. The second connection line CL2 is formed on the first insulating layer IL1 and is thus formed on the same layer as the first crossing portion CP1 and the first connection line CL1.

The first crossing portion CP1, the first connection line CL1, and the second connection line CL2 may be integrally formed and they include a light transmissive conductive material such as indium tin oxide or indium zinc oxide. That is, the first crossing portion CP1, the first connection line CL1, and the second connection line CL2 may be formed via a single process.

The second signal lines 222 are formed on the substrate 210 and extend in the second direction Y. A plurality of second signal lines 222 are formed and the second signal lines 222 are separated from each other and arranged in the first direction X that crosses that second direction Y. The second signal lines 222 include a second crossing portion CP2, third connection lines CL3, and fourth connection lines CL4.

The second crossing portion CP2 is formed on the substrate 210 in an area that crosses the first signal lines 221. The second crossing portion CP2 includes a connection portion MP and a floating portion FP.

The connection portion MP is formed between the substrate 210 and the first insulating layer IL1. The connection portion MP electrically connects the third connection lines CL3 to the floating portion FP and the fourth connection lines CL4 to the floating portion FP. The connection portion MP may include a conductive material such as a metal.

The floating portion FP neighbors the first crossing portion CP1 and is electrically insulated and separated at a distance from the first crossing portion CP1. The floating portion FP connects the third connection line CL3 to the fourth connection line CL4 via the connection portions MP. The floating portion FP is formed on the same layer as the first crossing portion CP1, the first connection line CL1, the second connection line CL2, the third connection line CL3, and the fourth connection line CL4.

The third connection lines CL3 are respectively connected to ends of the second crossing portions CP2 in the second direction Y and extend in the second direction Y. Each of third connection lines CL3 has a shape that expands in the second direction Y from the second crossing portion CP2. The third connection line CL3 is formed on the first insulating layer IL1 and thus is formed on the same layer as the floating portion FP of the second crossing portion CP2 and the fourth connection line CL4.

The fourth connection lines CL4 are respectively connected to the other ends of the second crossing portions CP2 in the second direction Y and extend in the second direction Y. Each of the fourth connection lines CL4 has a shape that expands in the second direction Y from the second crossing portion CP2. The fourth connection line CL4 is formed on the first insulating layer IL1 and thus is formed on the same layer as the floating portion FP of the second crossing portion CP2 and the third connection line CL3.

In the embodiment of FIGS. 3 to 5, floating portion FP of the second crossing portion CP2, the third connection line CL3, the fourth connection line CL4, the first crossing portion CP1, the first connection line CL1, and the second connection line CL2 are formed on the same layer and include the same light transmissive conductive material such as indium tin oxide or indium zinc oxide. That is, the floating portion FP of the second crossing portion CP2, the third connection line CL3, the fourth connection line CL4, the first connection line CL1, and the second connection line CL2 can be formed via a single process.

Thus, according to some embodiments, the floating portion FP of the second crossing portion CP2, the third connection line CL3, the fourth connection line CL4, the first crossing line CP1, the first connection line CL1, and the second connection line CL2 are formed via a single process. However, in other embodiments, the second crossing portion CP2 is formed through a separate process that is different from the process for forming the third connection line CL3, the fourth connection line CL4, the first crossing portion CP1, the first connection line CL1, and the second connection line CL2. In these embodiments, the second crossing portion CP2 overlaps the first crossing portion CP1.

According to embodiments, the first signal lines 221 and the second signal lines 222 respectively recognize the touch input of a user with various known shapes.

The second insulating layer IL2 covers the first and second signal lines 221 and 222 and may include a silicon oxide (SiOx) or silicon nitride (SiNx).

The identification pattern OP is viewed from at least one of the first and second signal lines 221 and 222, and in some embodiments, is viewed from each of the first and second signal lines 221 and 222.

In the embodiment of FIGS. 3 to 5, the identification pattern IP has a numeric shape, but it is not limited thereto. The identification pattern IP may have various shapes including text shapes.

The identification pattern IP is formed as an opening formed in each of the first and second signal lines 221 and 222.

The identification pattern IP includes first sub-identification patterns SP1 and second sub-identification patterns SP2.

The first sub-identification patterns SP1 are respectively formed in the first signal lines 221. The first sub-identification patterns SP1 formed at neighboring first signal lines 221 have different shapes. The first sub-identification patterns SP1 formed in the first and second connection lines CL1 and CL2 has substantially the same shape. For example, as shown in FIG. 4, the first sub-identification pattern SP1 has a substantially "7" shape in the first and second connection lines CL1 and CL2.

The first sub-identification patterns SP1 have shapes that respectively correspond to the locations of the first signal lines 221. The shapes of the first sub-identification patterns SP1 have a predetermined order in the second direction Y. For example, as shown in FIG. 3, the first sub-identification patterns SP1 in the first signal lines 221 have substantially the shapes of numbers "5", "6", "7", and "8" which are incremented in a predetermined order in the second direction Y. Thus, the first sub-identification patterns SP1 uniquely identify the first signal lines 221.

The second sub-identification patterns SP2 are respectively formed in the second signal lines 222. The second sub-identification patterns SP2 formed in neighboring second signal lines 22 have different shapes. The second sub-identification patterns SP2 are formed to have substantially the same shape in the third and fourth connection lines CL3 and CL4. For example, as shown in FIG. 4, the second sub-identification patterns SP2 have the shape of a "13" in the third and fourth connection lines CL3 and CL4. Thus, the second sub-identification patterns SP2 uniquely identify the second signal lines 222.

The second sub-identification patterns SP2 have shapes that respectively correspond to the locations of the second signal lines 222. The second sub-identification patterns SP2 have substantially the shapes of numbers arranged in a predetermined order in the first direction X. For example, as shown in FIG. 3, the second sub-identification patterns SP2 in the second signal lines 222 have substantially the shapes of numbers "12", "13", and "14" which are incremented in a predetermined order in the first direction X.

As described, according to at least one embodiment, the touch panel 200 included in the display device 1000 can optically determine accurate coordinates of the location where a failure occurs in a failure test of the touch panel 200 by respectively viewing the first and second sub-identification patterns SP1 and SP2 included in the identification patterns IP through openings formed in the first and second signal lines 221 and 222. That is, according to at least one embodiment, the touch panel 200 can optically determine the location where a failure occurs. In particular, when the size of the touch panel 200 increases, the coordinates of the location where a failure occurs can be optically determined with ease by viewing the identification patterns IP.

Hereinafter, a touch panel according to another exemplary embodiment will be described with reference to FIG. 6.

Figure 6:
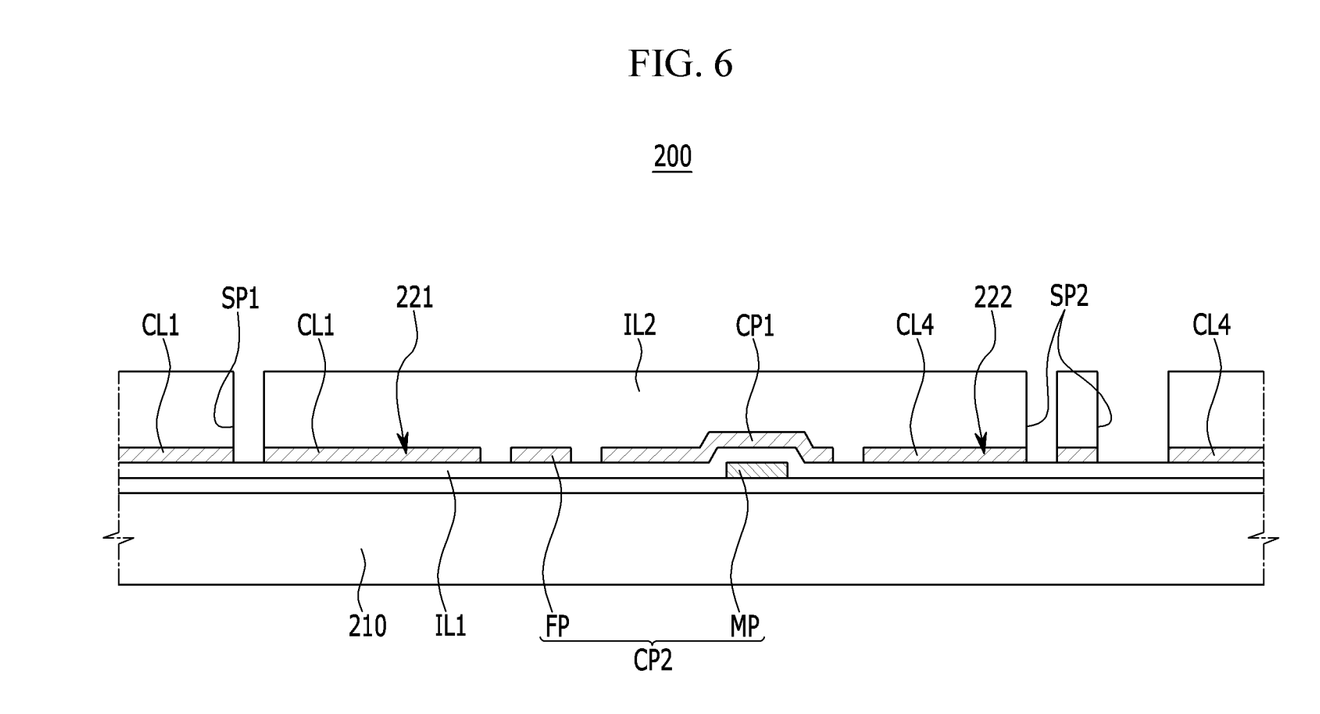
FIG. 6 is a cross-sectional view of a portion of a touch panel according to another exemplary embodiment.

As shown in FIG. 6, an identification pattern IP of a touch panel 200 is viewed through openings that are formed in a first signal line 221 and a second insulating layer IL2 and other openings that are formed in a second signal line 222 and a second insulating layer IL2.

In detail, first sub-identification patterns SP1 are formed as openings in a first signal line 221 and a second insulating layer IL2. Second sub-identification patterns SP2 are formed as openings in the second signal line 222 and the second insulating layer IL2.

As described, according to at least one embodiment, the touch panel 200 included in the display device 1000 can optically determine accurate coordinates of the location where a failure occurs in a failure test of the touch panel 200 by respectively viewing the first and second sub-identification patterns SP1 and SP2 included in the identification patterns IP through openings in the first and second signal lines 221 and 222. That is, according to at least one embodiment, the touch panel 200 can optically determine the location where a failure occurs. In particular, when the size of the touch panel 200 increases, the coordinates of the location where a failure occurs can be optically determined with ease by viewing the identification patterns IP.

Hereinafter, a touch panel according to another exemplary embodiment will be described with reference to FIG. 7.

Figure 7:
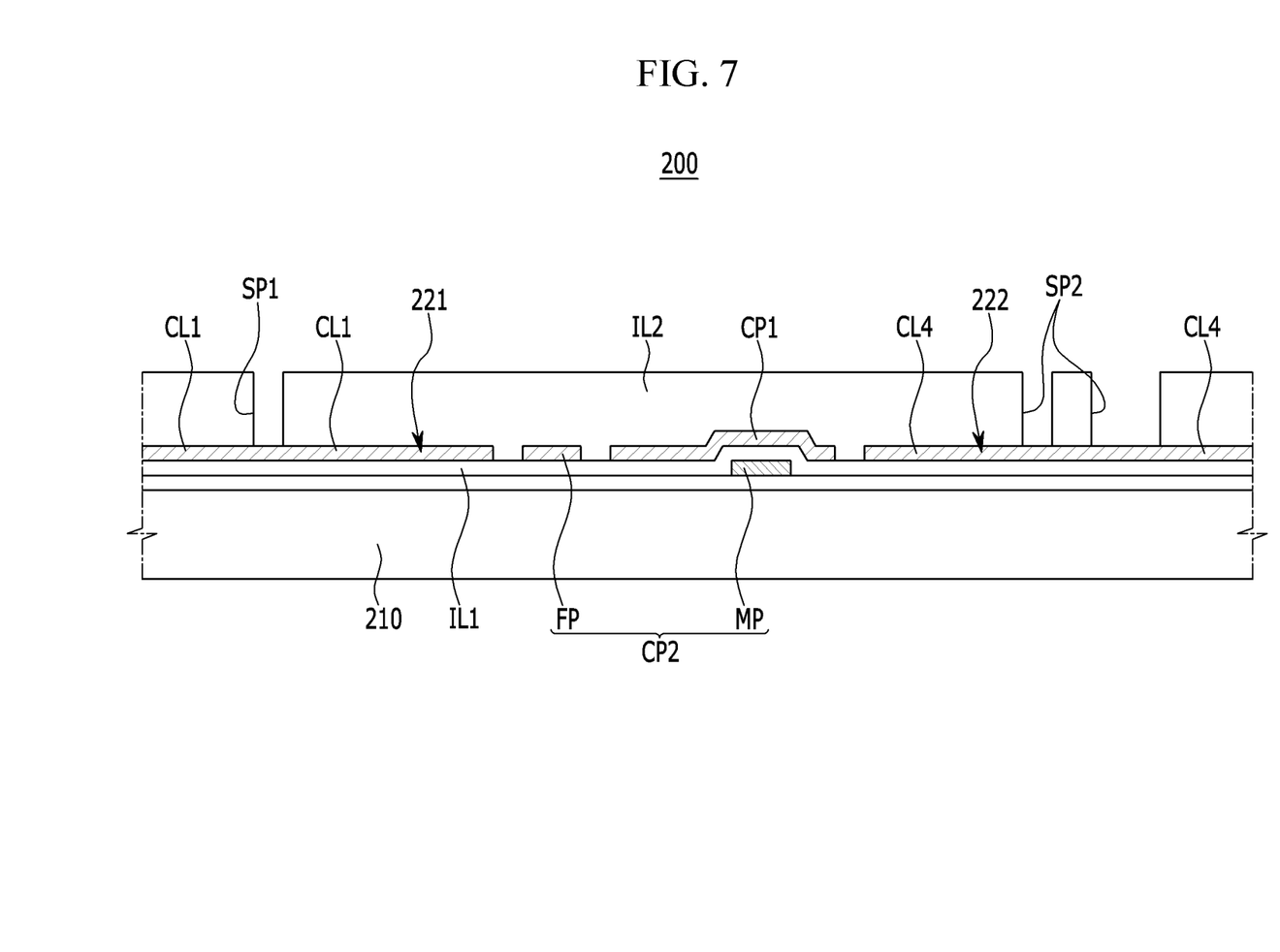
FIG. 7 is a cross-sectional view of a portion of a touch panel according to another exemplary embodiment.

As shown in FIG. 7, identification patterns IP of a touch panel 200 are viewed through openings formed in a second insulating layer IL2.

In detail, a first sub-identification pattern SP1 is formed as an opening in one portion of the second insulating layer IL2 that corresponds to a first signal line 221 and second sub-identification patterns SP2 are formed an opening in one portion of the second insulating layer IL2 that corresponds to a second signal line 222.

As described, according to at least one embodiment, the touch panel 200 included in the display device 1000 can optically determine accurate coordinates of the location where a failure occurs in a failure test of the touch panel 200 by respectively viewing the first and second sub-identification patterns SP1 and SP2 included in the identification patterns IP through openings over the first and second signal lines 221 and 222. That is, according to at least one embodiment, the touch panel 200 can optically determine the location where a failure occurs. In particular, when the size of the touch panel 200 increases, the coordinates of the location where a failure occurs can be optically determined with ease by viewing the identification patterns IP.

Hereinafter, a touch panel according to another exemplary embodiment will be described with reference to FIG. 8.

Figure 8:
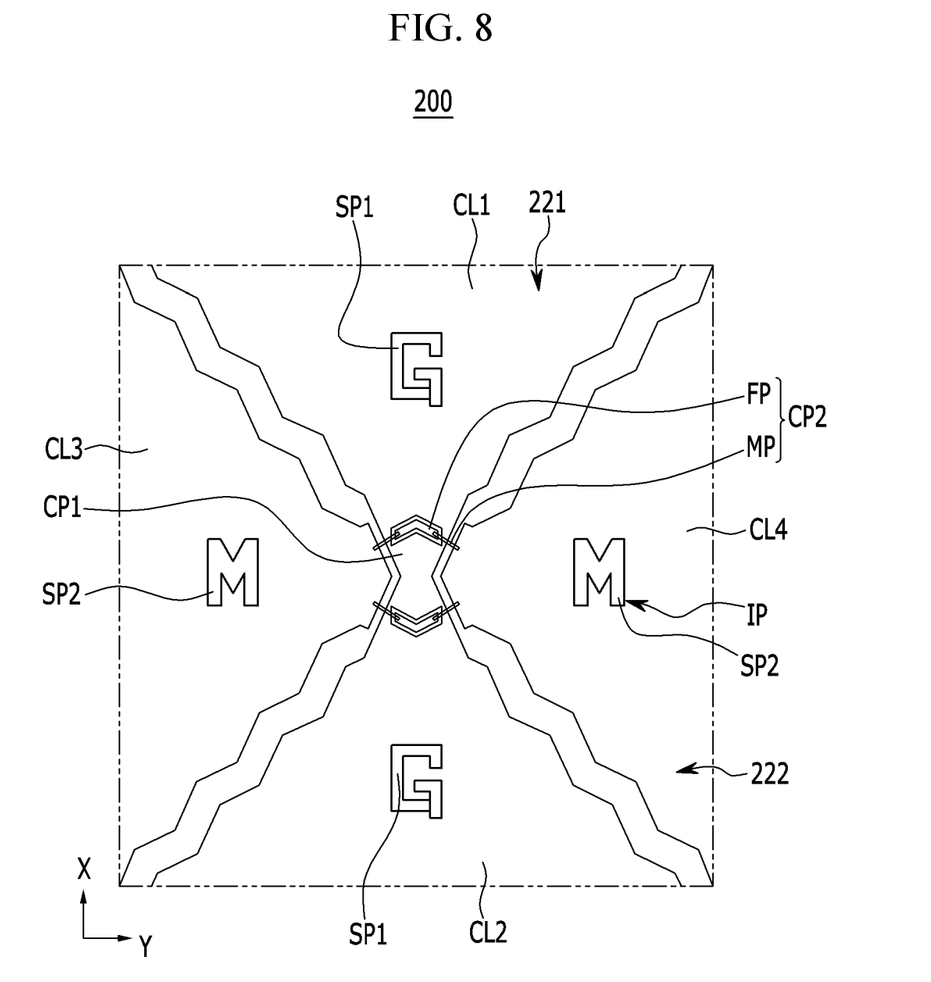
FIG. 8 is a top plan view of a touch panel according to another exemplary embodiment.

As shown in FIG. 8, identification patterns IP of a touch panel 200 have text shapes.

The identification patterns IP include first sub-identification patterns SP1 and second sub-identification patterns SP2.

The first sub-identification patterns SP1 are formed to have substantially the same shape in a first connection line CL1 and a second connection line CL2. For example, as shown in FIG. 8, the first sub-identification patterns SP1 have the shape of a "G" in the first and second connection lines CL1 and CL2.

The first sub-identification patterns SP1 have shapes that respectively correspond to the locations of the first signal lines 221. The shapes of the first sub-identification patterns SP1 have a predetermined order in a second direction Y. For example, the first sub-identification patterns SP1 in the first signal lines 221 have substantially the shapes of letters "E", "F", "G", and "H" arranged in a predetermined order in the second direction Y.

The second sub-identification patterns SP2 are formed to have substantially the same shape in a third connection line CL3 and a fourth connection line CL4. For example, as shown in FIG. 8, the second sub-identification patterns SP2 have the shape of an "M" in the third and fourth connection lines CL3 and CL4.

The second sub-identification patterns SP2 have shapes that respectively correspond to the locations of the second signal lines 222. The shapes of the second sub-identification patterns SP2 have a predetermined order in the first direction X. For example, the second sub-identification patterns SP2 in the second signal lines 222 have the shapes "L", "M", and "N", arranged in a predetermined order in the first direction X.

As described, according to at least one embodiment, the touch panel 200 included in the display device 1000 can optically determine accurate coordinates of the location where a failure occurs in a failure test of the touch panel 200 by respectively viewing the first and second sub-identification patterns SP1 and SP2 included in the identification patterns IP through openings in the first and second signal lines 221 and 222. That is, according to at least one embodiment, the touch panel 200 can optically determine the location where a failure occurs. In particular, when the size of the touch panel 200 increases, the coordinates of the location where a failure occurs can be optically determined with ease by viewing the identification patterns IP.

Hereinafter, a touch panel according to another exemplary embodiment will be described with reference to FIG. 9.

Figure 9:
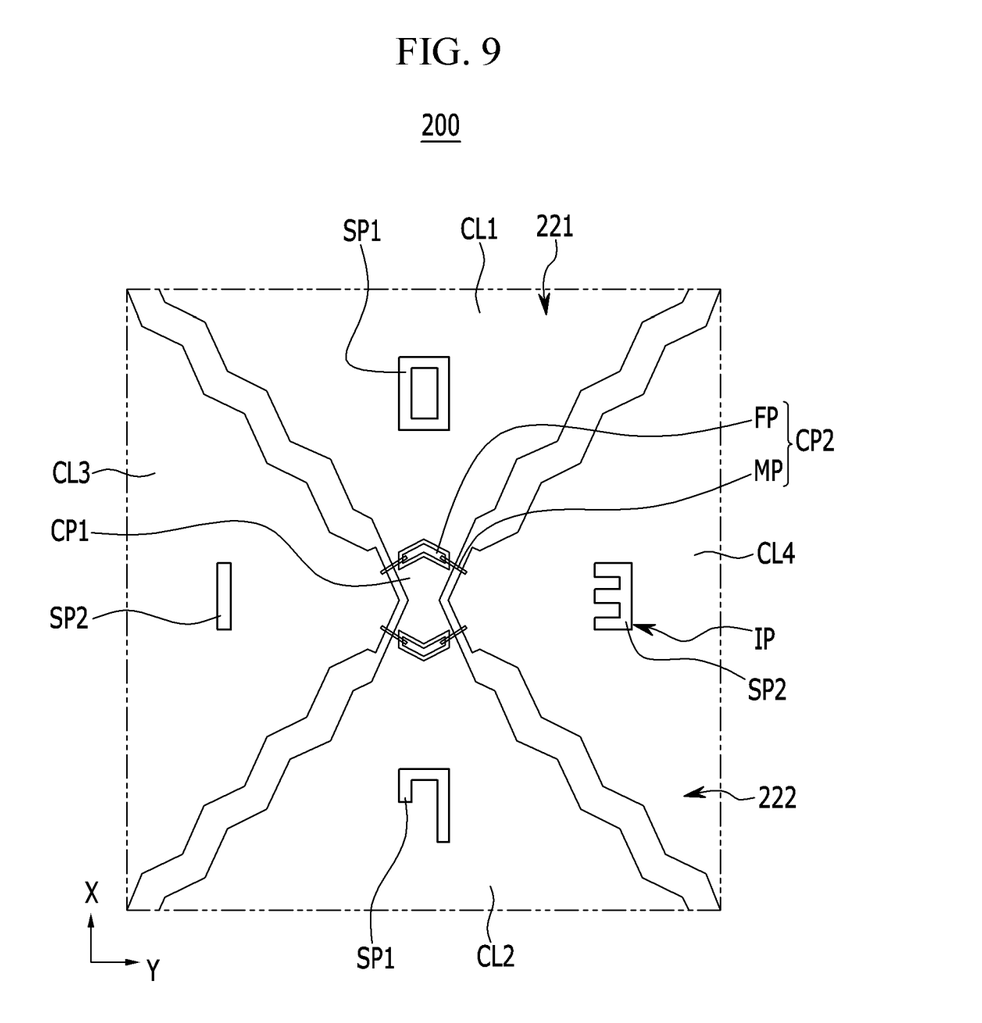
FIG. 9 is a top plan view of a portion of a touch panel according to another exemplary embodiment.

As shown in FIG. 9, first sub-identification patterns SP1 of identification patterns IP of a touch panel 200 are formed as a pair in a first connection line CL1 and a second connection line CL2. For example, as shown in FIG. 9, the first sub-identification pattern SP1 has the numerical value "0" in the first connection line CL1 and "7" in the second connection line CL2, and thus forms a pair represented as "07" by combining the first and second connection lines CL1 and CL2. This pair of first sub-identification patterns SP1 identify the location between the first and second connection lines CL1 and CL2 forming the pair.

Second sub-identification patterns SP2 are formed as a pair in a third connection line CL3 and a fourth connection line CL4. For example, as shown in FIG. 9, the second sub-identification pattern SP2 has the numerical value "1" in the third connection line CL3 and "3" in the fourth connection line CL4, thus forms a pair represented as "13" by combining the third and fourth connection lines CL3 and CL4. This pair of second sub-identification patterns SP2 identify the location between the third and fourth connection lines CL3 and CL4 forming the pair.

As described, according to at least one embodiment, the touch panel 200 included in the display device 1000 can optically determine accurate coordinates of the location where a failure occurs in a failure test of the touch panel 200 by respectively viewing the first and second sub-identification patterns SP1 and SP2 included in the identification patterns IP through openings formed in the first and second signal lines 221 and 222. That is, according to at least one embodiment, the touch panel 200 can optically determine the location where a failure occurs. In particular, when the size of the touch panel 200 increases, the coordinates of the location where a failure occurs can be optically determined with ease by viewing the identification patterns IP.

Hereinafter, a touch panel according to yet another exemplary embodiment will be described with reference to FIG. 10.

Figure 10:
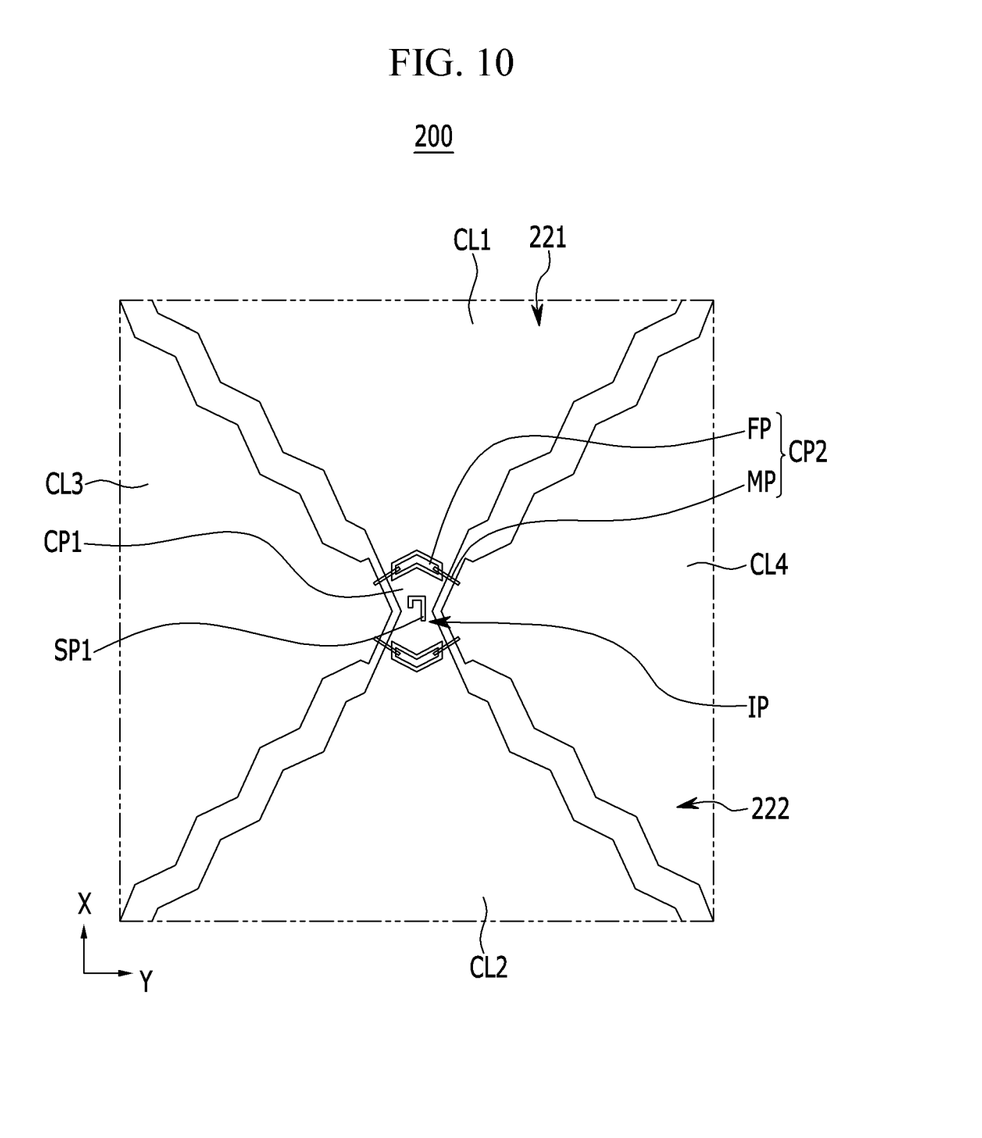
FIG. 10 is a top plan view of a touch panel according to yet another exemplary embodiment.

As shown in FIG. 10, identification patterns IP of a touch panel 200 include first sub-identification patterns SP1.

The first sub-identification patterns SP1 are respectively formed in a plurality of first signal lines 221 and are formed at a first crossing portion CP1. The first sub-identification patterns SP1 have shapes corresponding to the locations of the first signal lines 221. The shapes of the first sub-identification patterns SP1 have a predetermined order in a second direction Y. For example, as shown in FIG. 10, the first sub-identification pattern SP1 has a substantially number "7" shape which refers to a location corresponding to the first connection line CL1 at the first crossing portion CP1.

As described, according to at least one embodiment, the touch panel 200 included in the display device 1000 can optically determine accurate coordinates of the location where a failure occurs in a failure test of the touch panel 200 by respectively viewing the first sub-identification pattern SP1 included in the identification patterns IP through openings at the first signal lines 221. That is, according to at least one embodiment, the touch panel 200 can optically determine the location where a failure occurs. In particular, when the size of the touch panel 200 increases, the coordinates of the location where a failure occurs can be optically determined with ease by viewing the identification pattern IP.

Hereinafter, a touch panel according to still yet another exemplary embodiment will be described with reference to FIG. 11.

Figure 11:
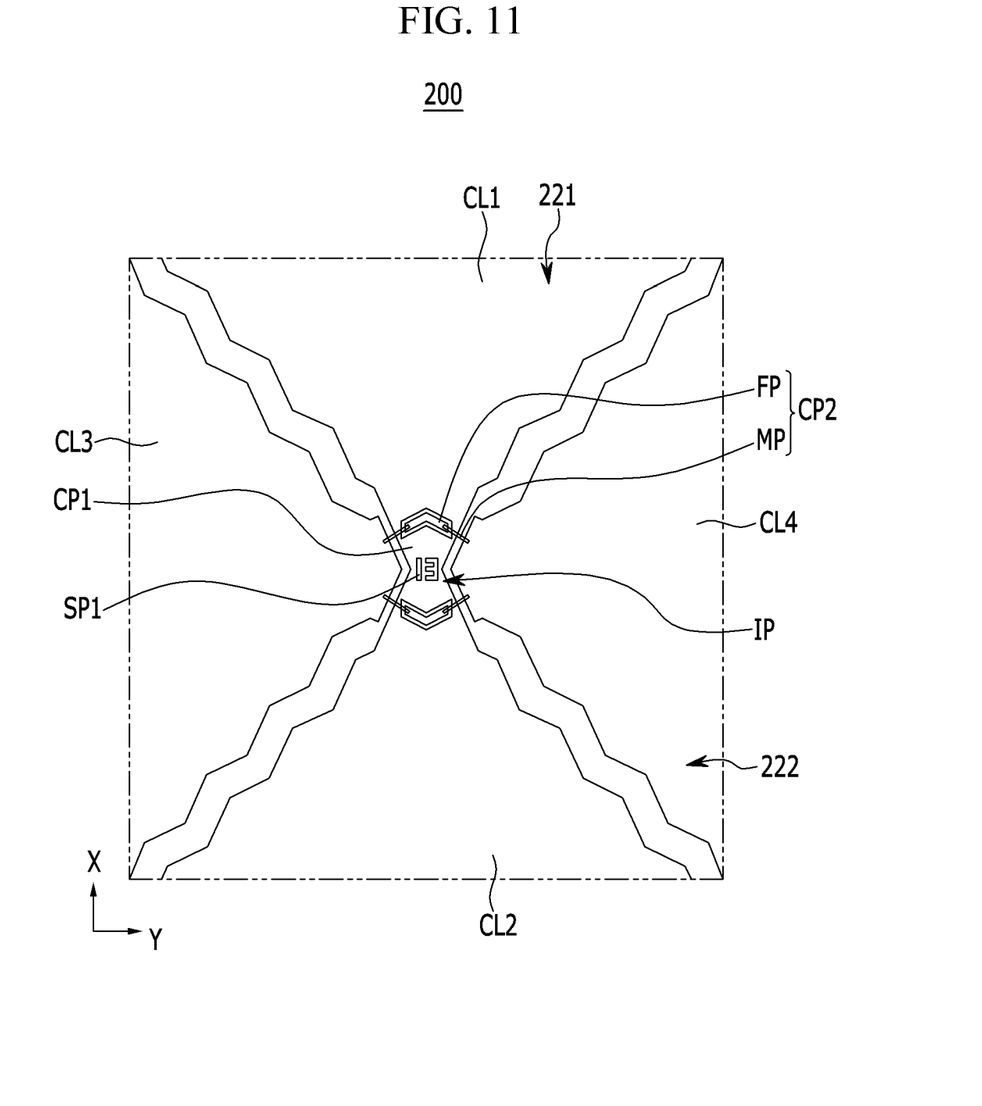
FIG. 11 is a top plan view of a part of a touch panel according to still yet another exemplary embodiment.

As shown in FIG. 11, identification patterns IP of a touch panel 200 include first sub-identification patterns SP1.

The first sub-identification patterns SP1 are respectively formed in the first signal lines 221 and are formed at a first crossing portion CP1. The first sub-identification patterns SP1 have shapes that correspond to the locations of a plurality of second signal lines 222. The shapes of the first sub-identification patterns SP1 have a predetermined order in a second direction Y. For example, as shown in FIG. 11, the first sub-identification pattern SP1 have a numerical value "13" refers to a location corresponding to the second connection line CL2 at the first crossing portion CP1.

As described, according to at least one embodiment, the touch panel 200 included in the display device 1000 can optically determine accurate coordinates of the location where a failure occurs in a failure test of the touch panel 200 by respectively viewing the first sub-identification patterns SP1 included in the identification patterns IP through openings in the first signal lines 221. That is, according to at least one embodiment, the touch panel 200 can optically determine the location where a failure occurs. In particular, when the size of the touch panel 200 increases, the coordinates of the location where a failure occurs can be optically determined with ease by viewing the identification pattern IP.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A touch panel, comprising:
   a substrate;
   at least one first signal line formed over the substrate and extending in a first direction;
   at least one second signal line formed over the substrate and extending in a second direction that crosses the first direction;
   a first insulating layer interposed between the substrate and both the first and second signal lines; and
   a second insulating layer covering the first and second signal lines,
   wherein a plurality of identification patterns are formed in areas corresponding to at least one of the first and second signal lines,
   wherein each of the identification patterns is formed as an opening in one of the first and second signal lines and the second insulating layer, and wherein the opening exposes a top surface of the first insulating layer.

2. The touch panel of claim 1, wherein each of the identification patterns is formed as an opening in the at least one of the first and second signal lines.

3. The touch panel of claim 1, wherein the identification patterns have numeric shapes.

4. The touch panel of claim 1, wherein the identification patterns have text shapes.

5. The touch panel of claim 1, wherein the at least one first signal line comprises a plurality of first signal lines and wherein the first signal lines are spaced apart from each other in the second direction.

6. The touch panel of claim 5, wherein the at least one second signal line comprises a plurality of second signal lines and wherein the second signal lines are spaced apart from each other in the first direction.

7. The touch panel of claim 6, wherein the identification patterns comprise a plurality of first sub-identification patterns respectively formed in the first signal lines and wherein the first sub-identification patterns formed in neighboring first signal lines have different shapes.

8. The touch panel of claim 7, wherein each of the first signal lines comprises:
   a plurality of first crossing portions formed at intersections between the first and second signal lines, wherein each of the first crossing portions includes first and second ends opposing each other in the first direction;
   a plurality of first connection lines respectively electrically connected to the first ends of the first crossing portions; and
   a plurality of second connection lines respectively electrically connected to the second ends of the first crossing portions.

9. The touch panel of claim 8, wherein the first sub-identification patterns are formed in the first and second connection lines and wherein the first sub-identification patterns formed in the same first signal line have substantially the same shape.

10. The touch panel of claim 8, wherein the first sub-identification patterns formed in the first and second connection lines connected to the same first crossing portion form a pair of first sub-identification patterns that identify the corresponding first crossing portion.

11. The touch panel of claim 8, wherein each of the first sub-identification patterns is formed in a corresponding one of the first crossing portions.

12. The touch panel of claim 11, wherein each of the first sub-identification patterns identifies the location of the corresponding first signal line.

13. The touch panel of claim 11, wherein each of the first sub-identification patterns identifies the location of the corresponding second signal line.

14. The touch panel of claim 7, wherein the first sub-identification patterns have substantially shapes of numbers arranged in a predetermined order in the second direction.

15. The touch panel of claim 6, wherein the identification patterns comprise a plurality of second sub-identification patterns respectively formed in the second signal lines and wherein the second sub-identification patterns formed in neighboring second signal lines have different shapes.

16. The touch panel of claim 15, wherein each of the second signal lines comprises:
- a plurality of second crossing portions formed at intersections between the first and second signal lines, wherein each of the second crossing portions includes first and second ends opposing each other in the second direction;
- a plurality of third connection lines respectively electrically connected to the first ends of the second crossing portions; and
- a plurality of fourth connection lines respectively electrically connected to the second ends of the second crossing portions.

17. The touch panel of claim 16, wherein the second sub-identification patterns are formed in the third and fourth connection lines and wherein the second sub-identification patterns formed in the same second signal line have substantially the same shape.

18. The touch panel of claim 16, wherein the second sub-identification patterns formed in the third and fourth connection lines connected to the same second crossing portion form a pair of second sub-identification patterns that identify the corresponding second crossing portion.

19. The touch panel of claim 1, further comprising a crossing portion at the intersection of the first and second signal lines, wherein at least two of the identification patterns are symmetrically located with respect to the crossing portion.

20. A display device, comprising:
- a display panel configured to display an image, and
- a touch panel formed over the display panel,
- wherein the touch panel comprises:
    - a substrate;
    - a plurality of first signal lines formed over the substrate and extending in a first direction;
    - a plurality of second signal lines formed over the substrate and extending in a second direction that crosses the first direction;
    - a first insulating layer interposed between the substrate and both the first and second signal lines; and
    - a second insulating layer covering the first and second signal lines,
- wherein a plurality of identification patterns are formed above at least one of the first and second signal lines,
- wherein each of the identification patterns is formed as an opening in one of the first and second signal lines and the second insulating layer, and wherein the opening exposes a top surface of the first insulating layer.

* * * * *